United States Patent
Watanabe

(10) Patent No.: US 7,368,715 B2
(45) Date of Patent: May 6, 2008

(54) SEMICONDUCTOR APPARATUS AND INFRARED LIGHT SENSOR

(75) Inventor: Hirofumi Watanabe, Miki (JP)

(73) Assignee: Ricoh Company, Ltd., Tokyo (JP)

( * ) Notice: Subject to any disclaimer, the term of this patent is extended or adjusted under 35 U.S.C. 154(b) by 18 days.

(21) Appl. No.: 11/540,144

(22) Filed: Sep. 29, 2006

(65) Prior Publication Data

US 2007/0102638 A1    May 10, 2007

(30) Foreign Application Priority Data

Sep. 30, 2005  (JP) .............................. 2005-287763

(51) Int. Cl.
*G01J 5/20*    (2006.01)
(52) U.S. Cl. .................................. 250/338.4
(58) Field of Classification Search ............... 250/338.4
See application file for complete search history.

(56) References Cited

U.S. PATENT DOCUMENTS

2006/0163670 A1*   7/2006  Ellis-Monaghan et al. .. 257/388

FOREIGN PATENT DOCUMENTS

JP          2663612        6/1997
JP          2001-284464    10/2001

* cited by examiner

*Primary Examiner*—Dave Porta
*Assistant Examiner*—Carolyn Igyarto
(74) *Attorney, Agent, or Firm*—Cooper & Dunham, LLP

(57) ABSTRACT

A semiconductor apparatus includes a pair of first and second field effect transistors formed on a semiconductor substrate. The pair of first and second field effect transistors has the same configurations except for respective gate electrode sections. The gate electrode sections include material having different respective work functions. A radiant ray sensing section is connected to the gate sections and senses a radiant ray. The radiant ray sensing section causes the pair of first and second field effect transistors to serve as a temperature sensor via the respective gate sections.

12 Claims, 7 Drawing Sheets

SEMICONDUCTOR APPARATUS AND INFRARED LIGHT SENSOR

TECHNICAL FIELD

The present disclosure relates to semiconductor apparatuses capable of sensing a radiant ray such as an infrared light, and infrared light sensors including the semiconductor apparatus.

BACKGROUND ART

Among infrared light sensors capable of sensing an infrared light, a thermo electric conversion element is well known. Such a thermo electric conversion element detects and converts an infrared light into heat using an infrared light absorption film, thereby detecting temperature of the heat, as discussed in Japanese Patent Registration No. 2663612.

Other than the infrared light sensor, a sensor using an electric field effect transistor is typically used. Such a sensor generates a voltage (PTAT: Proportional To Absolute Temperature) in proportion to an absolute temperature, as discussed in Japanese Patent Application Laid Open No. 2001-284464.

When temperature is to be detected, with high precision, using infrared light, a thermistor (TM) is typically used in addition to a thermopile provided in an infrared light sensor section to detect an ambient temperature of the infrared light sensor.

An analog signal processing circuit is necessarily used to amplify and compare two signals output from the infrared light sensor section and the thermistor (TM).

Further, the temperature sensor detects and determines temperature when the sensor counterbalances with an ambient temperature, as discussed in the Japanese Patent Application Laid Open NO. 2001-284464.

However, a problem remains unsolved in background devices.

SUMMARY

A novel semiconductor apparatus, according to an exemplary embodiment of this disclosure, comprises a pair of first and second field effect transistors (FETs) formed on a semiconductor substrate. The pair of first and second field effect transistors are the same configuration except for the gate electrode sections of the respective FETs. Each of the gate electrode sections of the pair of first and second field effect transistors includes material having a different work function. The gate electrode sections include a radiant ray sensing section connected to the gate section on the semiconductor substrate and senses a radiant ray. The radiant ray sensing section causes the pair of first and second field effect transistors to serve as a thermal sensor via the gate section.

In another aspect of this disclosure, an insulation film is configured to suppress heat diffusion from the radiant ray sensing section to the semiconductor substrate. The insulation film is positioned between the semiconductor substrate and the radiant ray sensing section in a thickness direction of the semiconductor substrate. The radiant ray sensing section is integral with the gate material via the insulation film on the radiant ray sensing section.

In yet another aspect, an air gap layer is included in the radiant ray sensing section and configured to insulate heat. The air gap layer is positioned between the semiconductor substrate and the insulation film in a thickness direction of the semiconductor substrate.

In another aspect, the semiconductor substrate includes a SOI (Si-On-Insulator) substrate.

In yet another aspect, the semiconductor substrate includes an oxide film on the SOI sub; the first and second field effect transistors; and a thin-walled section positioned beneath a sensor region including the radiant ray sensing section.

In another aspect, the radiant ray sensing section includes a radiant ray absorption member that causes radiant ray to more effectively work on the radiant ray sensing section.

In yet another aspect, the gate material creates a different work function by having different density and a type of impurity in between the pair of first and second field effect transistors.

In another aspect, the gate material and the radiant ray sensing section include polysilicon.

In yet another aspect, the radiant ray sensing section senses an infrared light.

BRIEF DESCRIPTION OF DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
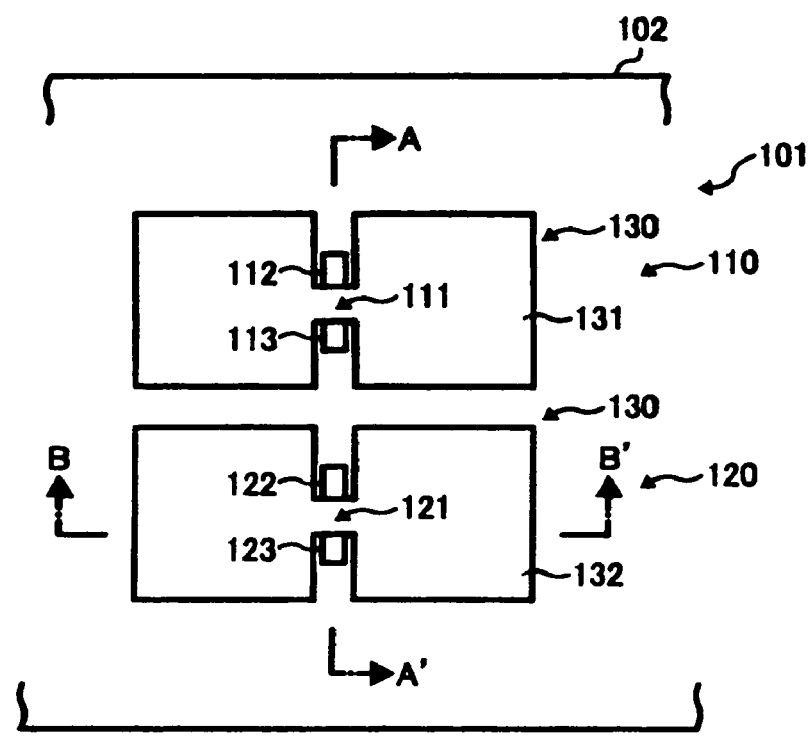
FIG. 1 is a plan view illustrating an exemplary semiconductor apparatus, according to one aspect of the present disclosure.

Referring now to the drawings, wherein like reference numerals and marks designate identical or corresponding parts throughout several figures, in particular in FIG. 1, a semiconductor apparatus 101 includes a semiconductor substrate 102 (e.g. a silicon substrate), a pair of MOS type first and second electric field effect transistors 110 and 120 on the semiconductor substrate 102, and a radiant ray sensing section 130 on the semiconductor substrate 102.

Initially, a typical operational principle of the pair of first and second electric field effect transistors 110 and 120 is described. A threshold voltage Vt for causing a MOS type electric field effect transistor to execute strong inversion is represented by the following first formula, wherein $\phi ms$ represents a difference between a work function $\phi m$ of a gate of a transistor and work function $\phi s$ of a semiconductor substrate, Qf represents an amount of fixed electric charge in an oxide film, $\phi f$ represents a Fermi level of a substrate, Qb represents an amount of electric charge in a depletion layer formed between an inversion layer and a substrate, and Cox represents an electrostatic capacity per unit area on the oxide film;

$$Vt = \phi ms - (Qf/Cox) + 2\phi f - (Qb/Cox).$$

Each of the pair of transistors M1 and M2 has the same structure except for density or a type of impurity of a gate electrode, and includes the threshold voltage Vt. Since values of items on the right side of the second item in the first formula are the same in the respective Vt for the M1 and M2, the difference $\Delta Vt$ can be represented by a difference in work function of each gate material employed in the respective MOS transistors M1 and M2 as calculated by the following second formula;

$$\Delta Vt = Vt(M1) - Vt(M2)$$
$$= \varphi ms(M1) - \varphi ms(M2)$$
$$= \varphi m(M1) - \varphi m(M2)$$

Further, when a gate material includes silicon (Si) is used, a work function $\phi m$ of a gate is represented by the following third formula, wherein an electron affinity of Si is X', a band gap is Eg', and a Fermi level is $\phi f'$;

$$\phi m = x' + (Eg'/2) + \phi f'.$$

Although polysilicon or that having silicides on its surface is more frequently used practically other than the Si, the function can be the same as above. Accordingly, the below described fourth formula is established, and a difference in Vt is represented by a difference in Fermi level;

$$\Delta Vt = \phi f'(M1) - \phi f'(M2).$$

Figure 14:
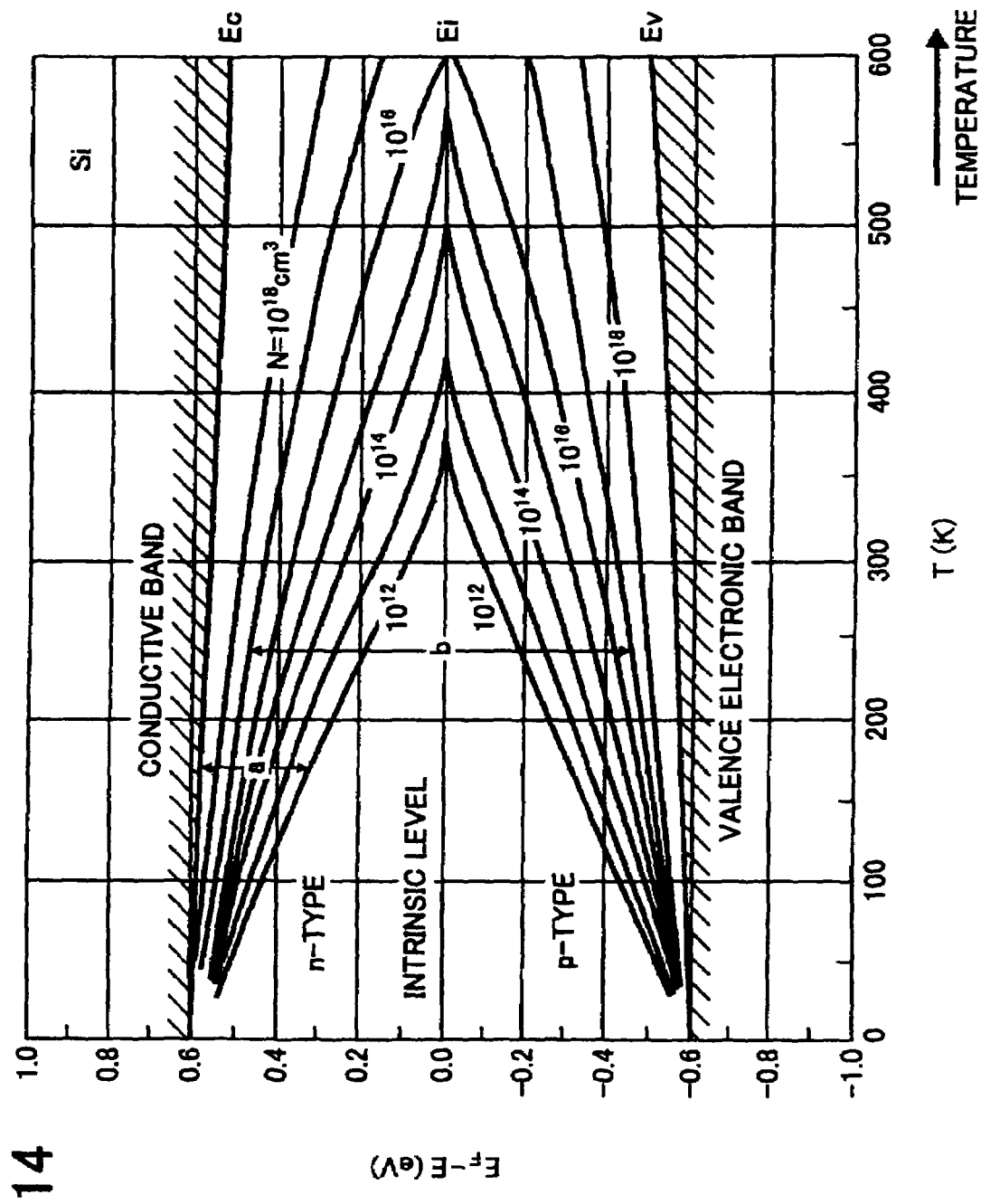
FIG. 14 is a graph illustrating an exemplary relation between a Fermi level of Si, temperature, and impurity density.

A relation between a Fermi level $\phi f$ of Si, temperature T, and impurity density N is illustrated in FIG. 14. As shown there, a voltage $\Delta Vt$ (shown by an arrow in the drawing) determined by a difference in Fermi level has a temperature characteristic. When a conduction type of the impurity is the same while the density of impurity is different (a case shown by (a) in the drawing), the voltage has a positive temperature characteristic. In contrast, when the conduction type of the impurity is different (a case shown by (b) in the drawing), the voltage has a negative temperature characteristic.

The above-mentioned operational principle is also adopted in the pair of first and second electric field effect transistors 110 and 120 according to one aspect of the present disclosure. Specifically, the first and second electric field effect transistors 110 and 120 include respective gate electrode sections 111 and 121, respective sources 112 and 122, and respective drains 113 and 123. The gate electrode sections 111 and 121 are different in configuration from the other, and remaining constructions are the same. The different configuration of the gate electrode sections 111 and 121 means that density or a type of impurity of the gate electrode sections 111 and 121 is different from the other. It also means that a channel length in one of the gate electrode sections 111 and 121 is different from that of the other, as mentioned later in detail.

Figure 2:
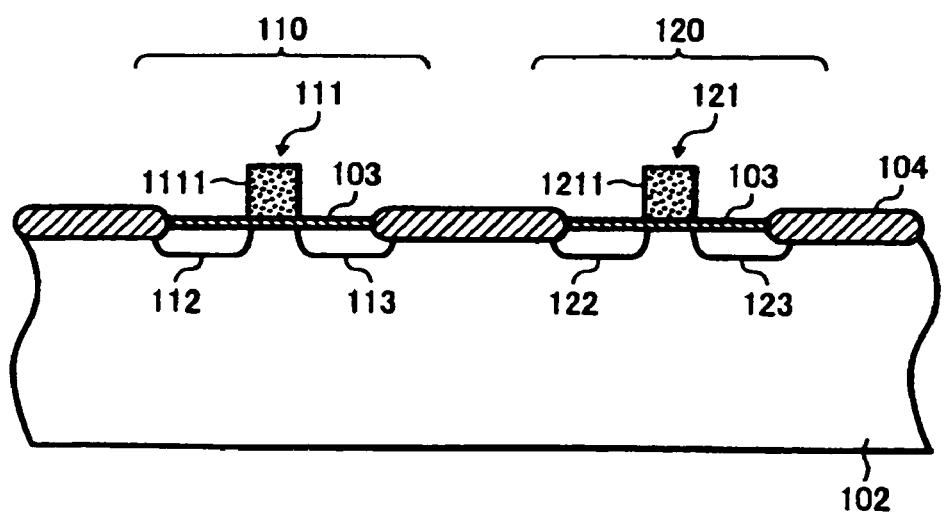
FIG. 2 is a cross sectional view illustrating the semiconductor apparatus when viewed from the A-A' cross section as illustrated in FIG. 1.

As shown in FIG. 2, the gate electrode sections 111 and 121 include gate oxide films 103 formed at a position corresponding to a channel section, which is formed from the respective sources 112 and 122 and the respective drains 113 and 123 on the semiconductor substrate 102, and respective gate sections 1111 and 1211 having material of different work functions. The gate sections 1111 and 1211 can be MOS capacitor sections in the first and second electric field effect transistors 110 and 120. Further, these gate sections 1111 and 1211 corresponding to the MOS capacitor sections correspond to a temperature sensing section. In several cross sectional views including FIG. 2, an insulation film overlying a transistor between layers, an aluminum wiring for taking out an electrode or, an infrared light absorption layer for effectively absorbing infrared light as mentioned later in detail or the like are omitted.

Specifically, the first and second electric field effect transistors 110 and 120 in the example of FIG. 2 are depression type transistors, and are formed within a p-well of a n-type semiconductor substrate 102. Further, respective impurity density of the semiconductor substrate 102 and a channel dope are the same, and each of substrate voltages is equalized to a source voltage, while the first and second electric field effect transistors 110 and 120 are serially connected. Further, the gate electrode section 111 of the first electric field effect transistors 110 is high density n-type, and the gate electrode section 121 of the second electric field effect transistor 120 is high density p-type.

Further, each transistor size W (channel width)/L (channel length) of the first and second electric field effect transistors 110 and 120 is designed to be the same. As mentioned above, the first and second electric field effect transistors 110 and 120 collectively form a pair of transistors, and a difference $\Delta Vt$ between threshold voltages Vt of these electric field effect transistors 110 and 120 corresponds to a difference in work function of the respective gate material of the gate sections 1111 and 1211. As mentioned above, since the conduction type of the impurity of the gate material of the gate electrodes 111 and 121 are differentiated from the other, the respective first and second electric field effect transistors 110 and 120 have negative temperature characteristics. However, to obtain a positive temperature characteristic, the first and second electric field effect transistors 110 and 120 can be appropriately modified.

The gate sections 1111 and 1211, only different from the other in the respective first and second electric field effect transistors 110 and 120, are constituted by polysilicon having different density impurity. Specifically, phosphorus is included as impurity in the polysilicon that forms the gate section 1111 so that density of the impurity is not less than $1\times10^{20}$ cm$^{-3}$. Phosphorus is also included as impurity in the polysilicon that forms the gate section 1211 so that density of the impurity is not less than $1.1\times10^{19}$ cm$^{-3}$ and not more than $1.6\times10^{19}$ cm$^{-3}$.

Now, the radiant ray sensing section 130 formed integrally with-the gate sections 1111 and 1211 on the semiconductor substrate 102 as constituted above are described more in detail. The radiant ray sensing section 130 is connected to the gate sections 1111 and 1211 and senses a radiant ray. The radiant ray sensing section 130 causes the first and second electric field effect transistors 110 and 120 to function as a thermal sensor via the gate sections 1111 and 1211.

As mentioned above with reference to FIG. 14, a difference ΔVt in threshold voltage Vt between the respective first and second electric field effect transistors 110 and 120 is represented by a difference in work function of gate material that forms the respective gate sections 1111 and 1211. A difference in Vt is represented by a difference in Fermi level. Further, as understood from FIG. 14, the voltage ΔVt determined by the Fermi level has temperature characteristic. Accordingly, the first and second electric field effect transistors 110 and 120 generate voltage in accordance with temperature of a temperature-measuring objective.

A change in temperature in the respective gate sections 1111 and 1211 is affected by radiant energy applied to the gate sections 1111 and 1211, and thermal capacities of the respective gate sections 1111 and 1211 as well as the semiconductor substrate 102. A thermal resistance of the gate oxide film 103 and the insulation film 104 each connecting the above mentioned members also affect the change. Accordingly, the larger the region that is thermally insulated, the larger the thermal capacity of the gate sections 1111 and 1211. Thus, the temperature of the gate sections 1111 and 1211 indicates a characteristic corresponding to entrance energy. Further, the respective gate sections 1111 and 1211 contact the semiconductor substrate 102 via the gate oxide film 103 as shown in FIG. 2.

However, although being intervened by the gate oxide film 103, each of the gate sections 1111 and 1211 is not thermally insulated perfectly from the semiconductor substrate 102.

Accordingly, a quantity of heat changed in the gate sections 1111 and 1211 in accordance with temperature of a temperature-measuring objective is small.

Further, heat generated in the gate sections 1111 and 1211 partially get scattered and lost to the semiconductor substrate 102 or the like via the gate oxide film 103.

Accordingly, temperature of the temperature-measuring objective cannot be highly precisely chased and measured if the gate sections 1111 and 1211 are only used without any devices.

Then, to efficiently change temperature in the gate sections 1111 and 1211 in accordance with temperature of the temperature measuring objective, the gate sections 1111 and 1211 are structured to have larger thermal capacity by connecting a radiant ray sensing section 130 to the gate sections 1111 and 1211.

As understood from the reason for installing the radiant ray sensing section 130, the radiant ray sensing section 130 preferably includes material that efficiently change temperature by receiving a radiant ray from the temperature measuring objective in accordance with temperature of the temperature measuring objective. For example, the radiant ray sensing section 130 preferably includes material, such as so called gold black (or niello), SiCr, Cr, Cu, $SiO_2$, $Si_3N_4$, etc. According to this embodiment, the radiant ray sensing section 130 is enabled to be readily and quickly manufactured by using a semiconductor process that produces a MOS transistor on a semiconductor substrate 102. Thus, the radiant ray sensing section 130 is integrally formed with the respective gate sections 1111 and 1211 by using polysilicon as used in the gates 1111 and 1211 in the same process of forming the respective gates 1111 and 1211.

As shown in FIG. 1, the radiant ray sensing section 130 is formed independent from that in the other one of first and second electric field effect transistors 110 and 120. For the sake of easy comprehension, numeral number 131 is assigned to a radiant ray sensing section 130 of the electric field effect transistor 110, and numeral number 132 is assigned to a radiant ray sensing section 130 of the electric field effect transistor 120. A shown, the respective radiant ray sensing sections 131 and 132 extend both in channel widthwise and lengthwise directions in the gate electrode sections 111 and 121 from the gate sections 1111 and 1211, and have the same areas. The size of the respective radiant ray sensing sections 131 and 132 is preferably determined such that heat capacity of the radiant ray sensing sections 131 and 132 can be larger than that of the gate sections 1111 and 1211 for a radiant ray emitted from the temperature measurement objective.

Further, although the radiant ray sensing sections 131 and 132 are arranged on both left and right sides of the gate electrode sections 111 and 121 as shown in FIG. 1, the radiant ray sensing sections 131 and 132 can be arranged on only one of the sides.

However, it is not preferable if the radiant ray sensing sections 131 and 132 are arranged on the right and left sides, respectively, and an emission amount of the radiant ray becomes different.

Figure 3:
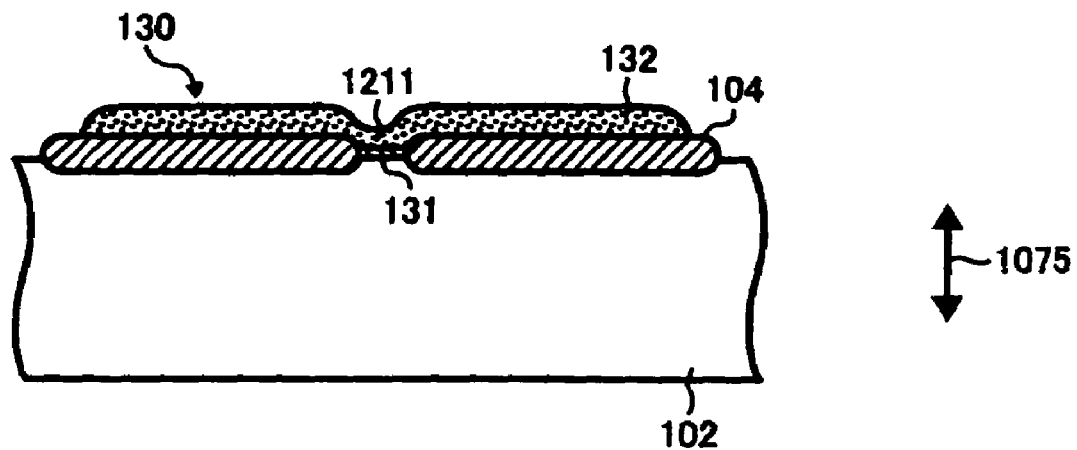
FIG. 3 is a cross sectional view illustrating the semiconductor apparatus when viewed from the B-B' cross section as illustrated in FIG. 1.

Further, since the radiant ray sensing section 130 is formed as shown in FIG. 1, the radiant ray sensing section 130 overlies a relatively thick insulation film 104, which is generally formed on the semiconductor substrate 102, as shown in FIG. 3.

Thus, the radiant ray sensing section 130 is thermally insulated relatively. A change in temperature caused in the gate sections 1111 and 1211 is affected by the radiation energy of entrance ray, heat capacities of the gate sections 1111 and 1211 and the semiconductor substrate 102 as well as thermal resistance between the gate oxide film 103 and the insulation film 104 as mentioned above. The larger an insulation region of the radiant ray sensing section 130, the larger the heat capacitance in the gate sections 1111 and 1211. Thus, temperature of the gate sections 1111 and 1211 has a characteristic corresponding to ray entrance energy.

In the semiconductor apparatus 101, the radiant ray sensing section 130 having relatively larger heat capacitance than the gate sections 1111 and 1211 generates or absorbs heat in accordance with temperature of a temperature measurement objective, i.e., an amount of a radiant ray from a temperature measurement objective. Along with a change in thermal condition in the radiant ray sensing section 130, the gate sections 1111 and 1211 integrated with the radiant ray sensing section 130 create a change in the thermal condition, and generate an electric signal in accordance with the change.

In this way, according to the semiconductor apparatus 101, the respective first and second electric field effect transistors 110 and 120 are formed on the semiconductor substrate 102, while the radiant ray sensing section 130 having the relatively larger heat capacitance than the gate sections 1111 and 1211 are formed integral with the gate sections 1111 and 1211 in these transistors 110 and 120.

Thus, the semiconductor apparatus 101 is in a form of a monolithic integral circuit, and is simpler than before.

Further, since the radiant ray sensing section 130 is formed integral with the gate sections 1111 and 1211, the radiant ray sensing section 130 can sense the radiant ray such as an infrared light and causes the first and second electric field effect transistors 110 and 120 to function as thermal sensors before the semiconductor apparatus 101 becomes balanced with an ambient temperature. Accordingly, temperature can highly precisely be detected with a monolithic integral circuit.

Further, since the insulation film 104 is inserted between the radiant ray sensing section 130 and the semiconductor substrate 102, diffusion of heat, generated at the radiant ray sensing section 130 due to a radiant ray, from the radiant ray sensing section 130 to the semiconductor substrate 102 can be reduced.

Accordingly, temperature detection can be highly precisely achieved. The above-mentioned heat represents both heat generation and absorption.

As mentioned earlier, the first and second electric field effect transistors 110 and 120 have the same size. However, differentiation of a channel length in the gate electrode sections 111 and 121 so as to increase temperature sensitivity does not spoil a function of a temperature sensor such as an infrared light sensor, and can be adopted upon need. Specifically, by differentiating a ratio of a channel length between the first and second electric field effect transistors 110 and 120, a temperature coefficient of a gate-source voltage (Voltage VPN) can be changed. Generally, to improve output precision as an important performance of a temperature detection circuit, it is preferable to increase a change in voltage (i.e., temperature coefficient) corresponding to temperature conversion and increase sensitivity in relation to the temperature change. Since the temperature coefficient of the voltage VPN changes in accordance with a ratio of the channel length, a prescribed temperature coefficient can be obtained by adjusting the ratio. Accordingly, by selecting a ratio of a channel length, a temperature coefficient of a voltage VPN can be more increased, and precision of an output from the temperature detection circuit can be improved.

Now, various modifications of the above-mentioned semiconductor apparatus 101 are described. For example, by using the above-mentioned function of the insulation film 104 while suppressing diffusion of heat, generated at the radiant ray sensing section 130 due to a radiant ray, from the radiant ray sensing section 130 to the semiconductor substrate 102, temperature can more highly precisely be detected. The following modifications provide more high precision temperature detection.

Figure 4:
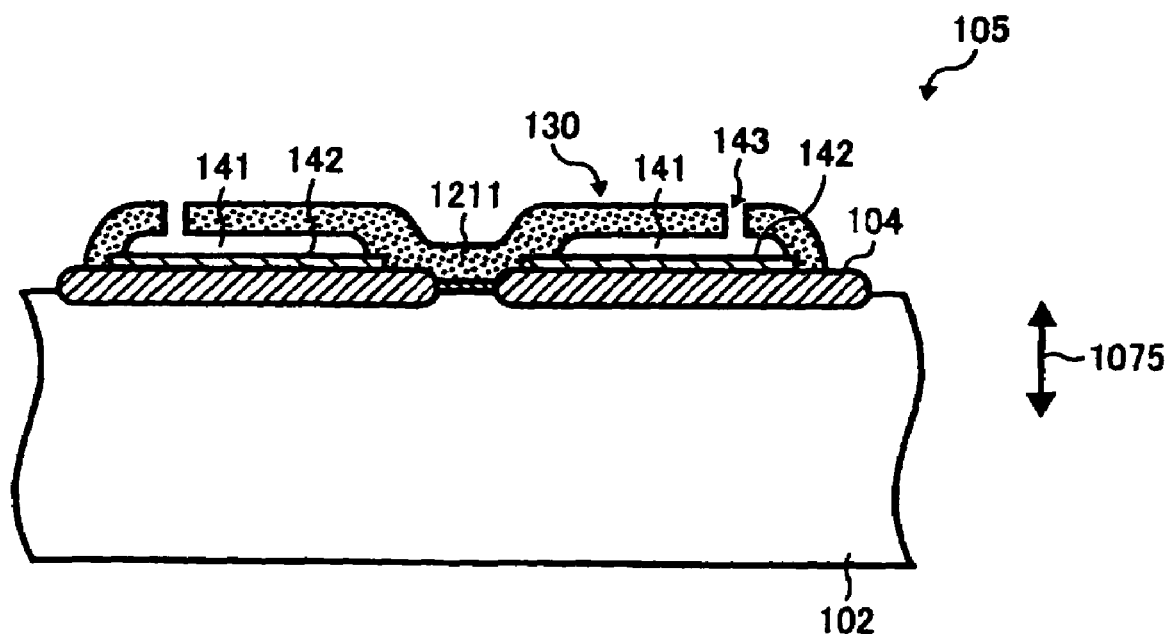
FIG. 4 is a cross sectional view illustrating an exemplary modification of the semiconductor apparatus of FIG. 1.

In a semiconductor apparatus 105 of FIG. 4, an air gap layer 141 for heat insulation use is formed between a radiant ray sensing section 130 of FIG. 3 and the insulation film 104. FIG. 4 illustrates a cross section of a second electric field effect transistor 120. Although the second electric field effect transistor 120 is only described herein below, a first electric field effect transistor 110 has the same configuration.

The air gap layer 141 is formed as follows. An insulation film 104 is initially formed. Then, a cover layer 142 including $Si_3N_4$ or the like is formed on the insulation film 104. A sacrifice layer including $SiO_2$ or the like is then formed on the cover layer 142. Then, a gate section 1211 and a radiant ray sensing section 132 are formed. Such a radiant ray sensing section 132 is formed on the sacrifice layer. FIG. 4 illustrates a condition in which the air gap layer 141 is ultimately produced while omitting the sacrifice layer. The sacrifice layer receives etching through an opening 143 formed on the radiant ray sensing section 132 and thus is removed. Thereby, the air gap layer 141 is formed. The cover layer 142 functions to suppress damage on the insulation film 104 during the etching the sacrifice layer.

By forming the air gap layer 141, heat generated at the radiant ray sensing section 130 due to a radiant ray is more suppressed to diffuse from the radiant ray sensing section 130 to the semiconductor substrate 102 than that in the configuration of FIG. 3. Accordingly, the semiconductor apparatus 105 can more highly precisely detect temperature.

Figure 5:
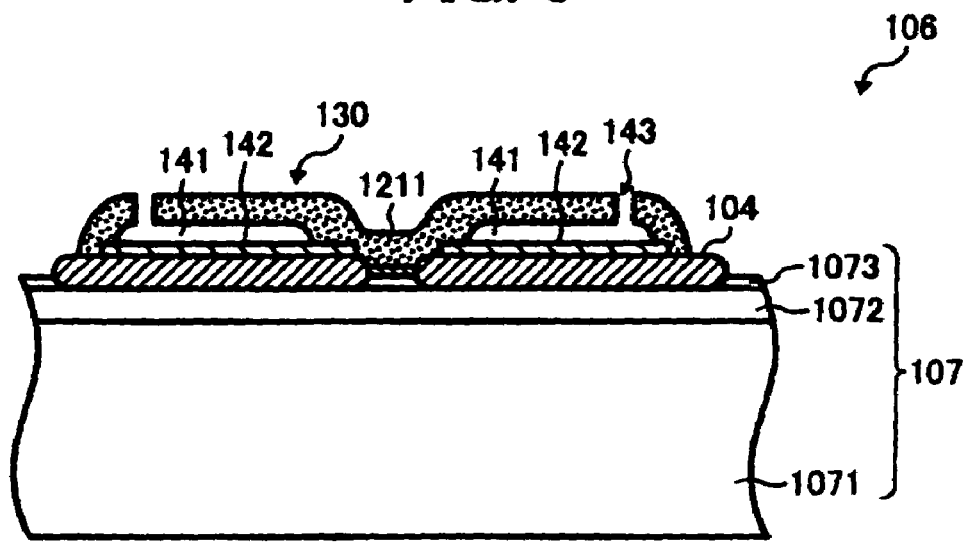
FIG. 5 is a cross sectional view illustrating another exemplary modification of the semiconductor apparatus of FIG. 1.

A semiconductor apparatus 106 of FIG. 5 is similarly configured to that in the configuration of FIG. 4, but employs a SOI substrate 107 for the semiconductor substrate. Although FIG. 5 only illustrates a second electric field effect transistor 120, a first electric field effect transistor 110 has the same configuration. The SOI substrate 107 includes an implant oxide film 1072 on the silicon substrate 1071 and a silicon layer 1073 overlying the implant oxide film 1072. When compared with the semiconductor apparatus 105 of FIG. 4, since the silicon layer 1073 below the gate section 1211 contacts the Si substrate 1071 of the SOI substrate 107 via the implant oxide film 1072, heat resistance until the Si substrate 1071 is larger in the semiconductor apparatus 106. Accordingly, the first and second electric field effect transistors 110 and 120 and the radiant ray sensing section 130 are thermally insulated satisfactorily from the Si substrate 1071. Thus, the semiconductor apparatus 106 can more highly precisely detect temperature.

Figure 6:
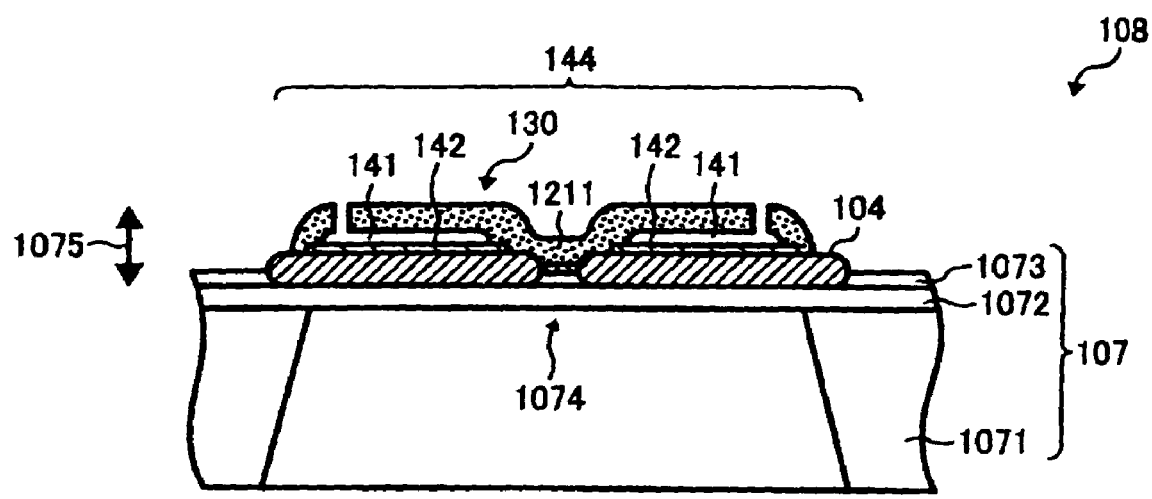
FIG. 6 is across sectional view illustrating still another exemplary modification of the semiconductor apparatus of FIG. 1.

A semiconductor apparatus 108 of FIG. 6 is an improvement of that of FIG. 5. To decrease heat capacity of the SOI substrate 107, an oxide film 1072 of the SOI substrate 107 and first and second electric field effect transistors 110 and 120 are arranged in a substrate thickness direction (1074). The SOI substrate 107 includes a thinner wall section 1074 beneath a sensor region 144 that includes the radiant ray sensing section 130. The thinner wall section 1074 is manufactured by partially etching and thus removing the Si substrate 1071 while leaving the implanting oxide film 1072 and the silicon layer 1073 on the SOI substrate 107 beneath the sensor region 144. The SOI substrate 107 is thus a diaphragm structure.

Figure 12:
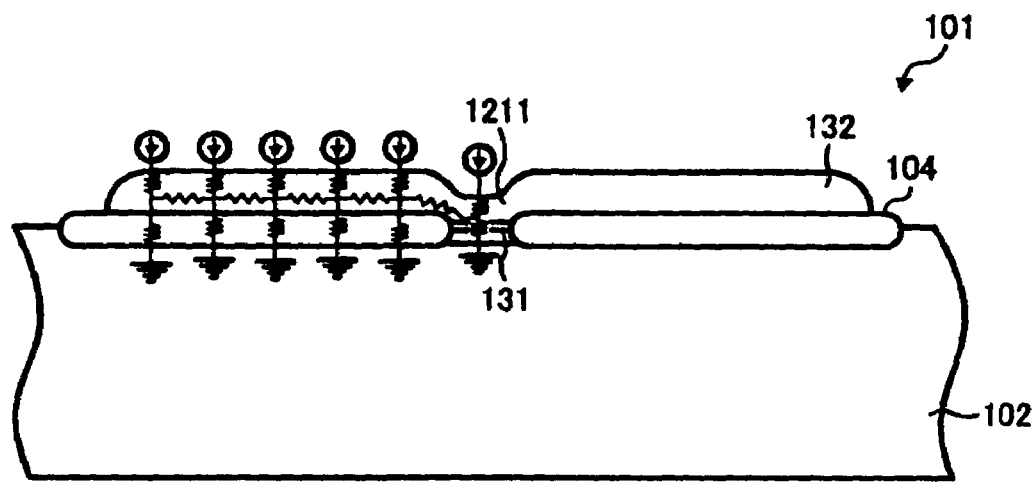
FIG. 12 is a schematic diagram illustrating a level of heat conduction in the radiant ray sensing section of the semiconductor apparatus of FIG. 3.
Figure 13:
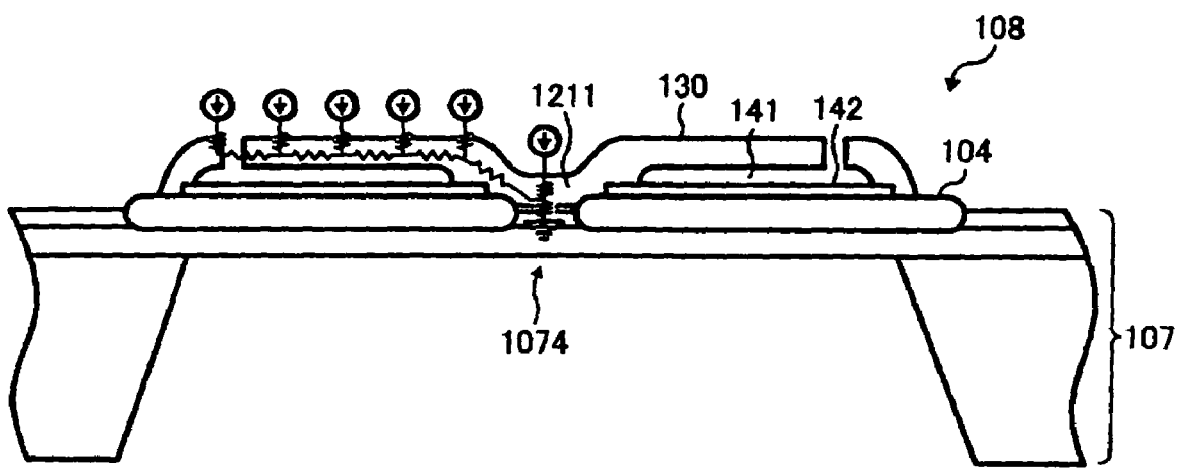
FIG. 13 is a schematic diagram illustrating a level of heat conduction in the radiant ray sensing section of the semiconductor apparatus of FIG. 6.

Referring to FIG. 12, heat is more easily conducted, relatively, from the radiant ray sensing section 130 to the semiconductor substrate 102 via the insulation film 104 in the semiconductor apparatus 101 of FIG. 3 when compared with that in the semiconductor apparatus 108 of FIG. 6. Referring to FIG. 13, heat conduction from the radiant ray sensing section 130 to the SOI substrate 107 is substantially cut off in the semiconductor apparatus 108 of FIG. 6.

Figure 7:
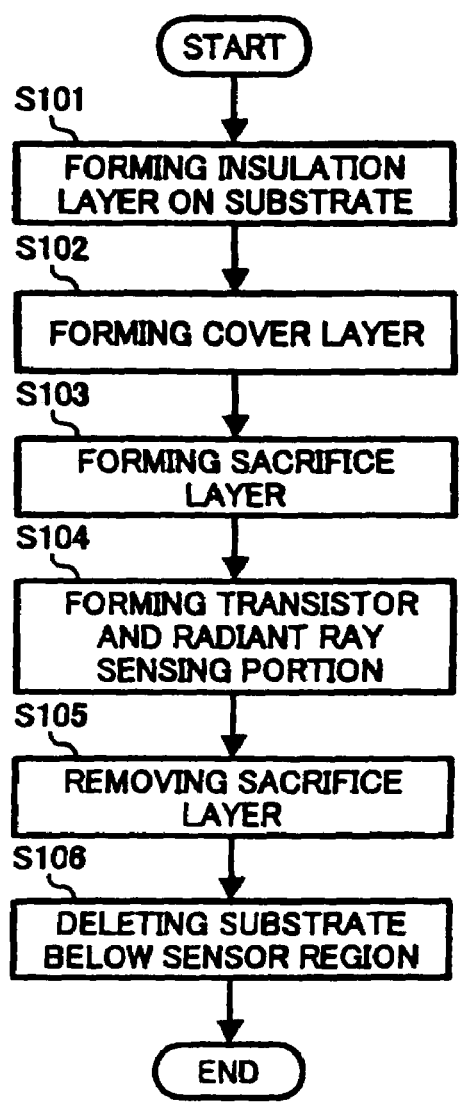
FIG. 7 is a flowchart illustrating a sequence of steps in a manufacturing process of the semiconductor apparatus of FIG. 6.

A method for manufacturing the semiconductor apparatus 108 includes the same steps up to a device formation step for manufacturing the semiconductor apparatus 106 of FIG. 5. However, wet etching is selectively executed finally from a rear side surface of the SOI substrate 107 as described below with reference to FIG. 7. In step S101, an insulation film 104 is formed on the SOI substrate 107 or the semiconductor substrate 102. At positions corresponding to the gates sections 1111 and 1211, gate oxide films 103 are formed. In step S102, a cover layer 142 is formed on the insulation film 104. A sacrifice layer is then formed on the cover layer 142 in step S103.

Both first and second electric field effect transistors 110 and 120 are formed in step S104, and a radiant ray sensing section 130 is formed integral with the gate sections 1111 and 1211 using polysilicon while overlying the sacrifice layer. The radiant ray sensing section 130 is partially perforated to make an opening 143 in step S105, and the sacrifice layer receives etching and is removed through the opening 143. Hence, the semiconductor apparatuses 105 and 106 of FIGS. 4 and 5 are manufactured.

Further, a substrate below the sensor region 144 of the semiconductor apparatus 106 selectively receives etching and is deleted in step S106. Hence, the semiconductor apparatus 108 of FIG. 6 is manufactured.

In particular, by employing either a hollow structure or a diaphragm structure, in the semiconductor apparatuses 105, 106, and 108 of FIGS. 4, 5, and 6, a heat resistance between the radiant ray sensing section 130 and the semiconductor substrate is certainly increased. Thus, by using polysilicon as an infrared light absorption layer in the radiant ray sensing section 130, the semiconductor apparatuses 105, 106, and 108 can especially suppress decreasing of a responsive speed caused by large heat resistance between the infrared light absorption layer and the gate sections 1111 and 1211. Thus, it can be used as a human detection sensor, for example. Here, the responsive speed represents a time period from when a radiant ray is sensed by the radiant ray sensing section 130 to when temperature of the radiant ray sensing section 130 starts increasing.

Figure 11:
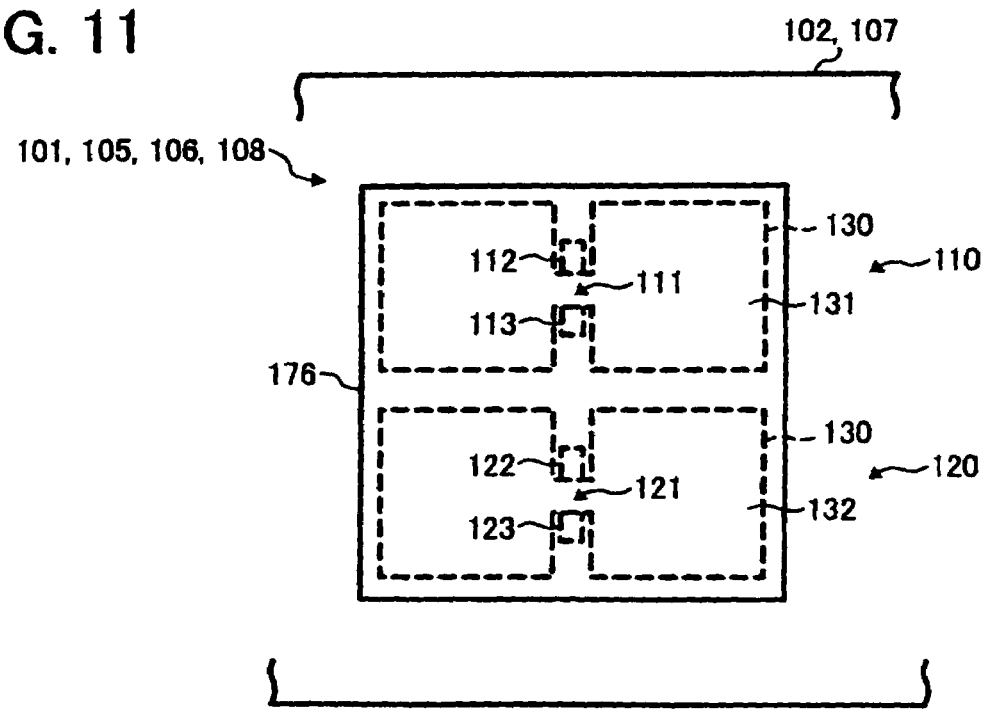
FIG. 11 is a plan view illustrating an exemplary semiconductor apparatus employing a radiant ray absorption member.

Further, to more improve the temperature detection sensitivity, a radiant ray absorption member 176 is preferably employed to overlie the sensor region including the first and second electric field effect transistors 110 and 120 as well as the radiant ray sensing section 130 in the semiconductor apparatuses 101, 105, 106, and 108 as shown in FIG. 11. The radiant ray absorption member 176 can neglect the sensor region 144 if at least overlying the radiant ray sensing section 130.

As the radiant ray absorption member 176, a metal thin film material such as Al, SiCr, Cr, Cu, etc., generally used in a semiconductor process is exemplified. Otherwise, a dielectric film, such as $SiO_2$, Si3N4, etc., having relatively lower infrared light transmission rate than silicon is preferably used to increase infrared light absorption efficiency. The most efficiently infrared light absorbing material is Niello (or Black metal), and can be formed on a passivation film of the topmost layer when a silicon device process is completed.

Figure 8:
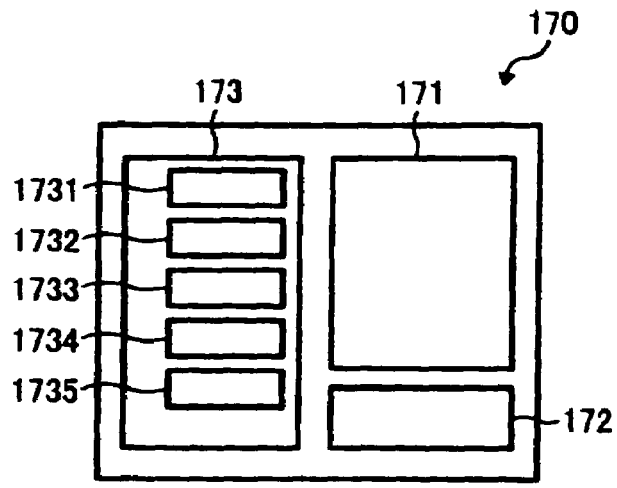
FIG. 8 is a plan view roughly illustrating an exemplary infrared light sensor, according to one aspect of the present disclosure.

Now, an exemplary infrared light sensor constructed by using one of the above-mentioned semiconductor apparatuses 101, 105, 106, and 108 is described. FIG. 8 roughly illustrates the infrared light sensor 170. The infrared light sensor 170 includes an infrared light sensor section 171, an ambient temperature measurement section 172, and a signal processing section 173. The infrared light sensor 170 is formed on a single semiconductor substrate as a one chip by using a semiconductor manufacturing process. The infrared light sensor section 171 is formed by one of the above-mentioned semiconductor apparatuses 101, 105, 106, and 108.

Figure 9:
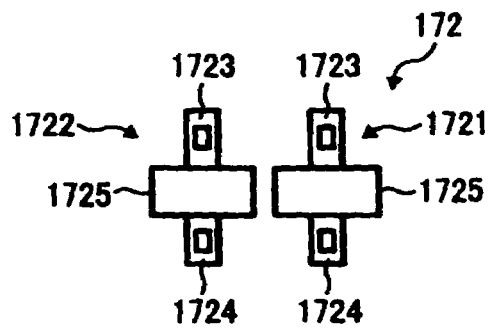
FIG. 9 is a plan view illustrating an exemplary ambient temperature measurement section in the infrared light sensor of FIG. 8.

The ambient temperature measurement section 172 constitutes a sensor for measuring ambient temperature around a temperature measurement objective. As in the first and second electric field effect transistors 110 and 120, the ambient temperature measurement section 172 includes a pair of third and fourth MOS type electric field effect transistors 1721 and 1722 that refer to a difference in work functions caused by a difference in respective gate materials between the gate sections 1111 and 1211 as shown in FIG. 9. The structure of the third and fourth electric field effect transistors 1721 and 1722 are the same as that of the first and second electric field effect transistors 110 and 120, except for a radiant ray sensing section 130. 1723 denotes respective sources of the third and fourth electric field effect transistors 1721 and 1722. 1724 denotes a drain section, while 1725 denotes a gate section.

In this way, the structure of the third and fourth electric field effect transistors 1721 and 1722 are the same as that of the first and second electric field effect transistors 110 and 120, except for a radiant ray sensing section 130, and these are manufactured by the same processes. Further, the infrared light sensor section 171 and the ambient temperature measurement section 172 are preferably arranged adjacent to each other, more preferably side by side, on the semiconductor substrate. Even if a manufacturing process changes and affects a device performance, the infrared light sensor section 171 and the ambient temperature measurement section 172 are enabled to receive influence at the same time. Thus, a change amount of the performance is offset, and temperature can be highly precisely measured.

The signal processing section 173 processes each of outputs from the infrared light sensor section 171 and the ambient temperature measurement section 172. The signal processing section 173 includes an amplifier section 1731 that amplifies the output signals from the infrared light sensor section 171 and the ambient temperature measurement section 172, a comparator 1732 that compares each of the amplified signals, and a calculation section 1733 that calculates temperature of the temperature measurement objective based on the comparison result. Further included are a storage section 1734 that stores data to recognize temperature of the temperature measurement objective predicted based on each of the output signals from the infrared light sensor section 171 and the ambient temperature measurement section 172, and an output section 1735 that outputs calculated temperature of the temperature measurement objective.

The infrared light sensor 170 thus structured operates as follows. Due to a radiant ray from the temperature measurement objective, the infrared light sensor section 171 generates heat at the radiant ray sensing section 130 as mentioned above. An electric signal is then transmitted from the first and second electric field effect transistors 110 and 120 in accordance with the heat. Since the first and second electric field effect transistors 110 and 120 constituting the infrared light sensor section 171 is designed to suppress conduction of heat, which is generated at the radiant ray sensing section 130 and conveyed to the semiconductor substrate side as mentioned above, an electric signal changes from point to point in accordance with the radiant ray from the temperature measurement objective.

Further, since the third and fourth electric field effect transistors 1721 and 1722 constituting the ambient temperature measurement section 172 do not include a radiant ray sensing section 130, heat generated at the respective gates 1725 of the third and fourth electric field effect transistors 1721 and 1722 are relatively easily conducted to the semiconductor substrate side. Thus, when a time period in which the gate section 1725 is thermally balanced with the semiconductor substrate has elapsed, that is, radiant ray from the temperature measurement objective or the infrared light sensor section is balanced, the ambient temperature measurement section 172 launches an electric signal corresponding to temperature of an environment in which the infrared light sensor 170 exists, that is, an ambient temperature of the temperature measurement objective. The signal processing section 173 compares temperature information of the temperature measurement objective supplied from the infrared light sensor section 171 and ambient temperature information supplied from the ambient temperature measurement section 172, and calculates and outputs an absolute temperature of the temperature measurement objective.

According to such an infrared light sensor 170, a thermistor (TM) is not necessary, in contrast to a conventional device. Therefore, a highly sensitive infrared light smart sensor can be obtained. Further, the infrared light sensor section 171, the ambient temperature measurement section 172 and the signal processing section 173 can be configured by using a typical CMOS process at low cost, and thereby can form a one-chip infrared light sensor 170.

Figure 10:
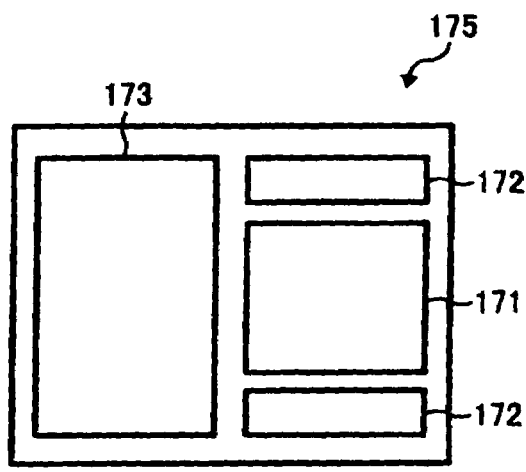
FIG. 10 is a plan view roughly illustrating an exemplary modification of the infrared light sensor of FIG. 8.

Further, a plurality of ambient temperature measurement sections 172 can be employed in the vicinity of the infrared light sensor section 171 similar to the infrared light sensor 175 of FIG. 10.

In the above-mentioned several embodiments, even though a MOS type electric field effect transistor is typically formed on a semiconductor substrate, other types can be utilized. Further, while a semiconductor apparatus is described as a temperature sensor for detecting infrared light, it can be included in thermoelectric conversion elements that sense a radiant ray and convert it into an electric signal. Further, the radiant ray may correspond to electromagnetic waves, such as an infrared light, etc.

Numerous additional modifications and variations of the present disclosure are possible in light of the above teachings. It is therefore to be understood that within the scope of the appended claims, the present disclosure may be practiced otherwise than as specifically described herein. For example, elements and/or features of different examples and illustrative embodiments may be combined with each other and/or substituted for each other within the scope of this disclosure and appended claims.

This application claims priority under 35 USC §119 to Japanese Patent Application No. 2005-287763, filed on Sep. 30, 2005, the entire contents of which are herein incorporated by reference.

What is claimed is:

1. A semiconductor apparatus, comprising:
   a pair of first and second electric field effect transistors formed on a semiconductor substrate, said pair of first and second electric field effect transistors having the same configurations except for respective gate electrode sections, said gate electrode sections including respective materials having different work functions; and
   a radiant ray sensing section connected to the gate sections on the semiconductor substrate and configured to sense a radiant ray, said radiant ray sensing section causing the pair of first and second field effect transistors to serve as a temperature sensor via the gate sections.

2. The semiconductor apparatus as claimed in claim 1, further comprising an insulation film inserted between the semiconductor substrate and the radiant ray sensing section and configured to suppress heat diffusion from the radiant ray sensing section to the semiconductor substrate, wherein the radiant ray sensing section is integral with the gates.

3. The semiconductor apparatus as claimed in claim 2, wherein the radiant ray sensing section includes an air gap layer configured to insulate heat, said radiant ray sensing section overlying the insulation film.

4. The semiconductor apparatus as claimed in claim 1, wherein said semiconductor substrate includes a SOI (Si-On-Insulator) substrate having an oxide film on the surface.

5. The semiconductor apparatus as claimed in claim 4, wherein the oxide film, the first and second electric field effect transistors, and the radiant ray sensing section collectively forms a sensor region, and wherein the SOI substrate includes a thin-walled section beneath the sensor region.

6. The semiconductor apparatus as claimed in claim 1, further including a radiant ray absorption member overlying the radiant ray sensing section and configured to cause radiant ray to more effectively work on the radiant ray sensing section.

7. The semiconductor apparatus as claimed in claim 1, wherein said materials of said respective gate sections of the pair of first and second field effect transistors have difference in one of impurity type and impurity density from each other, resulting in said different respective work functions.

8. The semiconductor apparatus as claimed in claim 1, wherein said gate material and the radiant ray sensing section include polysilicon.

9. The semiconductor apparatus as claimed in claim 1, wherein said radiant ray sensing section senses an infrared light.

10. An infrared light sensor, comprising:
    the semiconductor apparatus as claimed in claim 1;
    a pair of third and fourth field effect transistors having the same constructions as the first and second field effect transistors, said third and fourth field effect transistors being formed on the semiconductor substrate together with the first and second field effect transistors;
    an ambient temperature measuring section configured to measure ambient temperature of the semiconductor apparatus; and
    a signal processing section configured to process at least two outputs from the semiconductor apparatus and the ambient temperature measurement section, said ambient temperature measuring section being arranged on the semiconductor substrate together with the semiconductor apparatus while being connected to the semiconductor apparatus.

11. The infrared light sensor as claimed in claim 10, wherein said semiconductor apparatus and the ambient temperature measurement section are arranged adjacent to each other.

12. The infrared light sensor as claimed in claim 10, wherein said signal processing section including:
    an amplifier section configured to amplify signals output from the semiconductor apparatus and the ambient temperature measurement section, respectively;
    a comparison section configured to compare the respective signals after being amplified; and
    a calculation section configured to calculate temperature of a temperature measurement objective in accordance with the result of the comparison.

* * * * *